United States Patent [19]
Cho

[11] Patent Number: 5,817,555
[45] Date of Patent: Oct. 6, 1998

[54] METHOD FOR FABRICATING CAPACITOR OF SEMICONDUCTOR DEVICE USING HEMISPHERICAL GRAIN (HSG) POLYSILICON

[75] Inventor: Bok-Won Cho, Chungcheongbuk-do, Rep. of Korea

[73] Assignee: LG Semicon Co., Ltd., Chungcheongbuk-do, Rep. of Korea

[21] Appl. No.: 850,821

[22] Filed: May 2, 1997

[30] Foreign Application Priority Data

May 2, 1996 [KR] Rep. of Korea .................. 96-14165

[51] Int. Cl.⁶ .................................................. H01L 21/8242
[52] U.S. Cl. ........................................... 438/253; 438/255
[58] Field of Search ........................ 438/238–241, 438/253–256, 396–397

[56] References Cited

U.S. PATENT DOCUMENTS

| | | | |
|---|---|---|---|
| 5,047,817 | 9/1991 | Wakamiya et al. | |
| 5,140,389 | 8/1992 | Kimura et al. | |
| 5,284,787 | 2/1994 | Ahn | 438/253 |
| 5,597,755 | 1/1997 | Ajika et al. | 438/396 |
| 5,605,857 | 2/1997 | Jost et al. | 438/253 |

*Primary Examiner*—Jey Tsai

[57] ABSTRACT

A method for fabricating a capacitor of a semiconductor device, including the steps of: sequentially forming first and second insulating layers on a substrate; selectively etching the second insulating layer to form a first contact; forming a third insulating layer on the second insulating layer including the first contact; etching the third insulating layer placed on a capacitor region including the first contact, to expose the first contact, the first contact including the second insulating layer on the capacitor region; etching the first insulating layer placed in the first contact; forming a first conductive layer on the capacitor region and third insulating layer; forming a temporary layer on the first conductive layer placed on the capacitor region; etching the first conductive layer placed on the third insulating layer using the temporary layer as a mask; removing the temporary layer, and forming a dielectric layer on the surface of the first conductive layer; and forming a second conductive layer on the dielectric layer.

20 Claims, 3 Drawing Sheets

METHOD FOR FABRICATING CAPACITOR OF SEMICONDUCTOR DEVICE USING HEMISPHERICAL GRAIN (HSG) POLYSILICON

BACKGROUND OF THE INVENTION

The present invention relates to a method for fabricating a capacitor of a semiconductor device, such as a thin film capacitor.

A conventional method for fabricating a capacitor will be explained below with reference to FIG. 1. First of all, an oxide layer 103 and nitride layer 104 are formed on a semiconductor substrate 101 in which an impurity diffusion region 102 is formed. A portion of nitride layer 104 placed on the impurity diffusion region 102 is selectively etched, and oxide layer 103 is etched using the nitride layer as a mask, to form a contact hole. This contact hole is for the purpose of electrically connecting the impurity diffusion region 102 to a sidewall spacer part 109-2 of a storage electrode of the capacitor via a connector part 109-1 of the storage electrode formed on and in the contact hole.

Polysilicon is then deposited on the nitride layer 104 including the contact hole, and an oxide layer is formed thereon. The oxide layer is patterned through photolithography to form an oxide layer pillar, and the polysilicon layer is patterned to form a lower storage electrode 109-1. Thereafter, polysilicon is deposited on the overall surface of the substrate, and etched back, to form a storage electrode having a cylindrical shape. Then, the oxide layer pillar is removed to form a storage electrode 109, and a dielectric layer 110 is formed on the surface of storage electrode 109. Polysilicon is deposited on the overall surface of the substrate, and patterned to form a plate electrode 111, completing the capacitor.

In the capacitor fabricated through the above-mentioned conventional method, an uneven portion is produced on its surface due to its cylindrical structure, and it may collapse during the formation of the cylinder structure. Also, since the top of the cylinder is sharp-pointed, its leakage current is high, resulting in deterioration of the device. Furthermore, an increase of the capacitance per unit area is continuously required.

SUMMARY OF THE INVENTION

It is an object of the present invention to provide a method for fabricating a capacitor, such as a thin film capacitor, which is suitable for increasing its capacitance but decreasing its leakage current.

To accomplish the object of the present invention, there is provided a method for fabricating a capacitor of a semiconductor device, including the steps of: sequentially forming first and second insulating layers on a substrate; selectively etching the second insulating layer to form a first contact; forming a third insulating layer on the second insulating layer including the first contact; etching the third insulating layer and the first insulating layer at the first contact to form a capacitor region; forming a first conductive layer on the capacitor region; forming a dielectric layer on the first conductive layer; and forming a second conductive layer on the dielectric layer.

The first and third insulating layers are formed of materials having similar etch rates, and the first and second insulating layers are formed of materials having different etch rates from each other.

Furthermore, a transistor including a gate electrode, source and drain electrodes is formed on a semiconductor substrate, a first insulating layer is formed on the overall surface of the substrate, a bit line is formed on a portion of the first insulating layer, a second insulating layer is formed on the overall surface of the substrate, and a portion of the second insulating layer placed where a contact hole will be formed is selectively etched, to form a storage electrode having a cylindrical form, thereby increasing the its capacitance.

BRIEF DESCRIPTION OF THE DRAWINGS

The novel features believed characteristic of the invention, as well as other features and advantages thereof, will best be understood by reference to the following detailed description of particular embodiments, read in conjunction with the accompanying drawings, wherein.

DETAILED DESCRIPTION OF PREFERRED EMBODIMENTS

Figure 1:
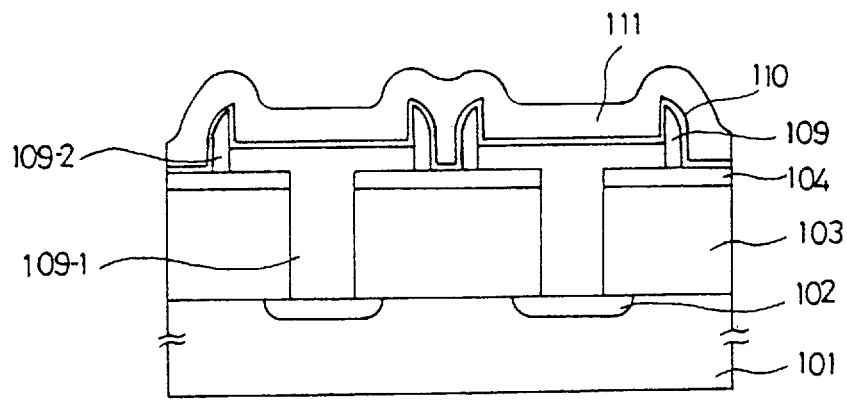
FIG. 1 is a cross-sectional view of a conventional capacitor.
Figure 2A:
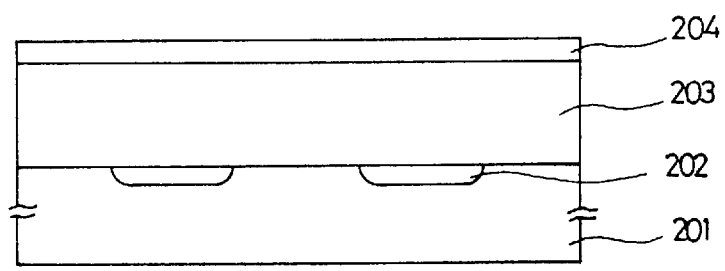
FIGS. 2A to 2F are cross-sectional views showing a method for fabricating a capacitor according to an embodiment of the present invention.

Preferred embodiments of the present invention will be explained below with reference to the accompanying drawings. FIGS. 2A to 2F are cross-sectional views showing a method for fabricating a capacitor according to an embodiment of the present invention. As shown in FIG. 2A, first and second insulating layers 203 and 204 are sequentially formed on a semiconductor substrate 201 on which a circuit element (impurity diffusion region 202) connected to a capacitor is formed. Here, first and second insulating layers 203 and 204 are formed of materials which have different etch selectivity relative to each other, and the thickness of the first and second insulating layers are determined with regard to the etch selectivity and whole topography of the substrate. For example, the first insulating layer is formed of a planarization layer boron phosphorous silicon glass (BPSG), and the second insulating layer is formed of a nitride.

Figure 2B:
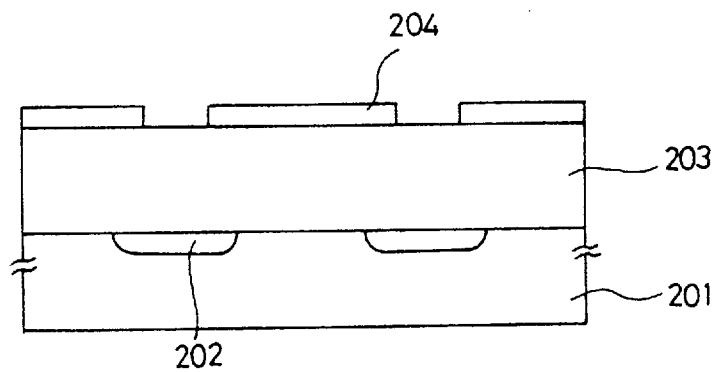
Figure 2C:
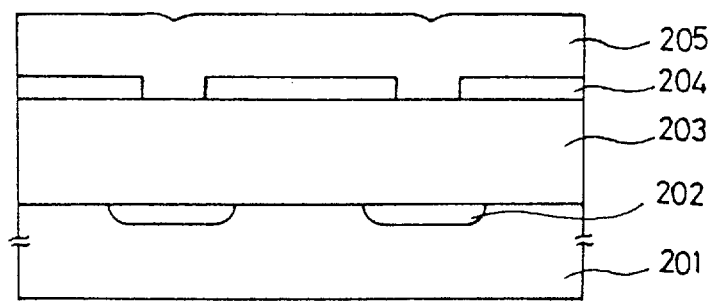

As shown in FIG. 2B, second insulating layer 204 is selectively removed by an amount corresponding to a desired contact hole size using photolithography. As shown in FIG. 2C, a third insulating layer 205 is formed on the second insulating layer 204. Here, the thickness of third insulating layer 205 is controlled to secure a desired capacitance with regard to the global topography and capacitance. Third insulating layer 205 is formed of a material having an etch rate similar or identical to that of the first insulating layer 203. For example, the third insulating layer is formed of a chemical vapor deposition (CVD) oxide layer. That is, in the inventive method for fabricating a capacitor, two or three kinds of insulating layers are used in three layers. Among these three insulating layers, the middle layer has a large etch selectivity relative to the first and third layers. The thicknesses of the first and third insulating layers are controlled with regard to the etch selectivity.

Figure 2D:
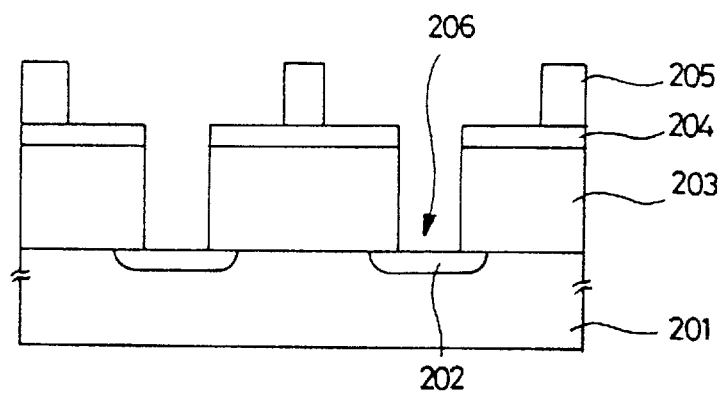
Figure 2E:
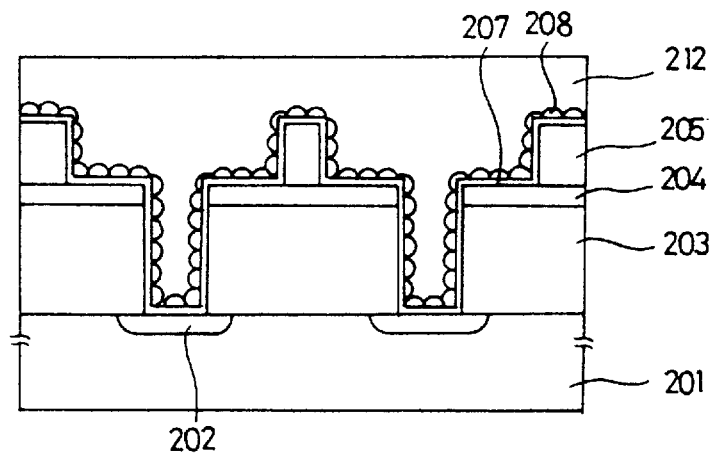

As shown in FIG. 2D, a photoresist pattern is formed on the third insulating layer 205 to define a portion of the third insulating layer 205 in which a cylindrical electrode of the capacitor will be formed. This portion of the third insulating layer 205 is wider than the contact hole in the second insulating layer 204. The third and first insulating layers 205 and 203 are selectively etched through photolithography, to form a contact hole 206. Contact hole 206 is formed in the shape of crown having a step form. Then, as shown in FIG. 2E, a metallic layer of Ti/TiN and W are sequentially deposited on the overall surface of the substrate through reactive sputtering or low pressure chemical vapor deposition (LPCVD), to form a first conductive layer for the purpose of forming at least a part of a storage electrode 207 of the capacitor. The storage electrode 207 is preferably formed also to include hemispherical grain polysilicon 208 which increases the surface area of the conductive layer. Then, a planarization layer (temporary layer) 212 is formed of spin on glass (SOG) or BPSG, to bury the contact hole. The planarization layer 212 is also formed in a portion over the contact hole, in which the third insulating layer is removed.

Figure 2F:
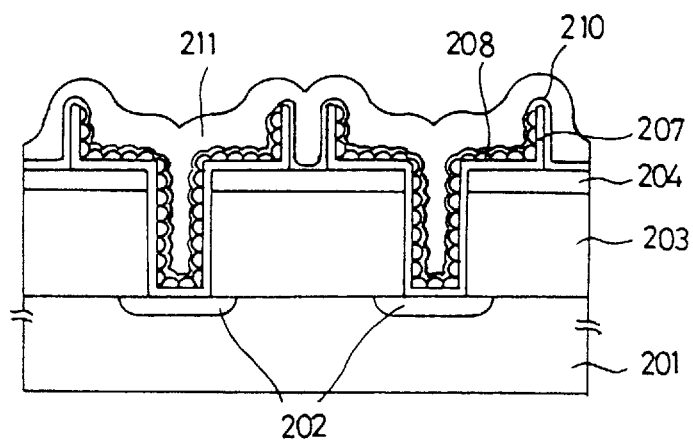

As shown in FIG. 2F, planarization layer 212 is removed through chemical mechanical polishing (CMP) to expose the surface of the third insulating layer 205, thereby removing the first conductive layer placed on the third insulating layer. The CMP process uses a slurry capable of removing the planarization layer 212 and the storage electrode of the capacitor. Again using photolithography, the now-exposed third insulating layer 205 is selectively attached to expose the second insulating layer 204 (which has a different selectivity than the third insulating layer 205). Then, the remaining planarization layer is removed, preferably through a wet etch, to expose the storage electrode 208.

Thereafter, a capacitor dielectric layer 210 is formed on the storage electrode through LPCVD, PECVD (Plasma Enhanced CVD), ECR-PECVD (Electron Cyclotron Resonance-PECVD) or metal-organic CVD (MOCVD). Dielectric layer 210 is formed of $Ta_2O_5$ or BSTO, and it is formed to a desired thickness with regard to the capacitance of the device. Then, for the purpose of stabilizing the thin dielectric layer, appropriate heat treatment is carried out. Finally, a conductive material like polysilicon or tin is deposited on the dielectric layer, to form a plate electrode 211.

Figure 3:
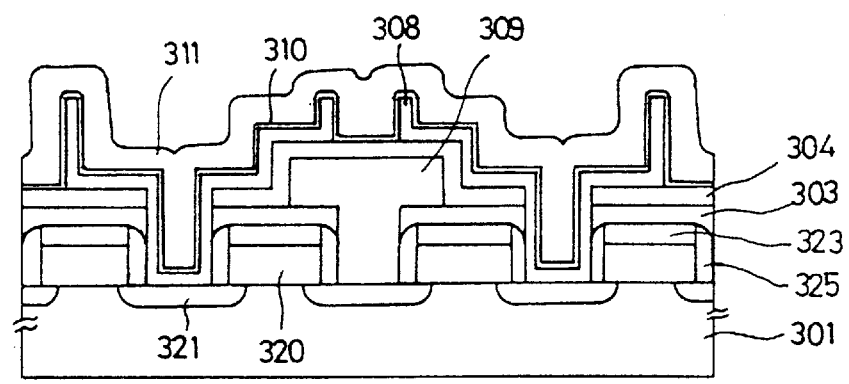
FIG. 3 is a cross-sectional view showing a capacitor according to another embodiment of the present invention.

FIG. 3 is a cross-sectional view of a capacitor according to another embodiment of the present invention. In this embodiment, a gate electrode 320 is formed on a substrate 301. A gate oxide (not depicted) can alternatively be formed between the substrate 301 and the gate electrode 320. A transistor (including a gate 320 and source and drain electrodes 321) is formed as shown generally in FIG. 2A. A gate cap oxide 323 is formed on the gate electrode 320. Side wall spacers 325 are formed against the sides of the gate electrode after the gate oxide 323 is formed. A first insulating layer 303 is then formed on the gate cap oxide 323 and the side wall spacers 325. Then, a bit line 309 is formed before forming a second insulating layer 304.

After formation of the bit line 309, the same process is carried out as that of the aforementioned embodiment. That is, the second insulating layer 304 is formed, and portions thereof over the diffusion structures 321 (i.e., regions that will correspond to the contact holes) will be selectively etched as shown generally in FIG. 2B (where the layer 204 is etched in regions above the diffusion structure 202). A third insulating layer is formed on the overall exposed surface, and a photoresist pattern is formed on the third insulating layer to define a portion in the third insulating layer in which the cylindrical electrode of the capacitor will be formed. The third and first insulating layers are simultaneously etched through photolithography, to form the contact hole.

Thereafter, conductive materials like Ti/TiN and W for forming a storage electrode 308 of the capacitor are sequentially deposited on the exposed overall surface, and a planarization layer is formed thereon of SOG or BPSG. Alternatively, the storage electrode 308 could be formed similarly to the first embodiment, i.e., having an additional conductive layer of hemispherical grain polysilicon on the layer 308. The planarization layer is removed through a CMP process to expose the surface of the third insulating layer, and then the planarization layer remaining is completely removed. By doing so, capacitor storage electrode 308 is formed, and its surface is exposed. Then, capacitor dielectric layer 310 is formed on the storage electrode, and capacitor plate electrode 311 is formed thereon.

According to the present invention, when the size of the node mask for the storage electrode and the height of the global topography are the same, actual capacitor area is increased, and thus the global topography is improved. Also, the storage electrode has no sharp portion, thereby improving the leakage current of the device. Since the insulating layer is formed, etched through CMP and removed through a wet etch, the isolation between neighboring elements can be secured. Furthermore, it is possible to maximally utilize the inter-layer dielectric layer to reduce the global topography.

Therefore, it should be understood that the present invention is not limited to the particular embodiment disclosed herein as the best mode contemplated for carrying out the present invention, and further that the present invention is not limited to the specific embodiments described in this specification except as defined in the appended claims.

What is claimed is:

1. A method for fabricating a capacitor of a semiconductor device, comprising the steps of:

sequentially forming first and second insulating layers on a substrate;

selectively etching said second insulating layer to form a first contact hole;

forming a third insulating layer on said second insulating layer including said first contact hole;

etching said third insulating layer and said first insulating layer at said first contact hole to form a capacitor region;

forming a first conductive layer on said capacitor region;

forming a hemispherical grain (HSG) polysilicon layer on said conductive layer;

forming a dielectric layer on said HSG polysilicon layer; and forming a second conductive layer on said dielectric layer.

2. The method for fabricating a capacitor of a semiconductor device as claimed in claim 1, wherein said first and third insulating layers are formed of materials having similar etch rates, and said first and second insulating layers are formed of materials having different etch rates.

3. The method for fabricating a capacitor of a semiconductor device as claimed in claim 2, wherein said first insulating layer is formed of an oxide layer, said second insulating layer is formed of a nitride layer, and said third insulating layer is formed of a CVD oxide layer, said oxide layer having a planarization characteristic.

4. The method for fabricating a capacitor of a semiconductor device as claimed in claim 1, wherein said first and third insulating layers are formed of an identical material, and said first and second insulating layers are formed of materials having different etch rates.

5. The method for fabricating a capacitor of a semiconductor device as claimed in claim 1, wherein:

said first conductive layer is formed on said capacitor region and on said third insulating layer; and said method further comprises:

forming a temporary layer on said HSG polysilicon layer placed on said capacitor region;

etching said HSG polysilicon layer and said first conductive layer placed on said third insulating layer; and removing said temporary layer.

6. The method for fabricating a capacitor of a semiconductor device as claimed in claim 5, wherein the substep of etching said HSG polysilicon layer and said first conductive layer includes using said temporary layer as a mask.

7. The method for fabricating a capacitor of a semiconductor device as claimed in claim 5, wherein said substep of etching said HSG polysilicon layer and said first conductive layer is performed in a manner that said HSG polysilicon layer and said first conductive layer placed over said third insulating layer are etched while the surface of said substrate is planarized through CMP.

8. The method for fabricating a capacitor of a semiconductor device as claimed in claim 5, wherein said substep of removing said temporary layer includes removal by wet etching.

9. A method for fabricating a capacitor of a semiconductor device, comprising the steps of:

sequentially forming first and second insulating layers on a substrate on which an impurity diffusion region is formed, and etching a first portion of said second insulating layer where a first contact hole will be formed, said impurity diffusion region being connected to a capacitor;

forming a third insulating layer on a second portion of said second insulating layer, said third insulating layer being a boundary region between neighboring capacitors;

etching a portion of said first insulating layer to form a second contact hole below said first contact hole;

forming a conductive layer on the overall surface of said substrate;

forming a hemispherical grain (HSG) polysilicon layer on said conductive layer;

forming a planarization layer on said HSG polysilicon layer to planarize the surface of said substrate, the planarization layer being formed thicker than a height of said third insulating layer;

removing said planarization layer, said HSG polysilicon layer and said conductive layer placed on said third insulating layer, then removing a remainder of said planarization layer, a remaining portion of said HSG polysilicon layer and said conductive layer being effective together as a storage electrode of a capacitor; and sequentially forming a dielectric layer and a plate electrode on said storage electrode.

10. The method for fabricating a capacitor of a semiconductor device as claimed in claim 9, wherein said step of removing includes the substeps of:

using CMP to remove said planarization layer, said HSG polysilicon layer and said conductive layer placed on said third insulating layer; and using a wet etch to remove remaining portions of said planarization layer and to remove said third insulating layer.

11. A method for fabricating a capacitor of a semiconductor device, said method comprising the steps of:

forming a transistor on a semiconductor substrate, forming a first insulating layer on the overall surface of said substrate, forming a bit line on a portion of said first insulating layer, forming a second insulating layer on the overall surface of said substrate, and etching a portion of said second insulating layer where a contact hole is to be formed, said bit line being connected to said transistor;

forming a third insulating layer on a portion of said second insulating layer, and etching a portion of said first insulating layer to form a contact hole, said third insulating layer being a boundary region between neighboring capacitors;

forming a conductive layer on the overall surface of said substrate, forming a hemispherical grain (HSG) polysilicon layer on said conductive layer, forming a planarization layer on said HSG polysilicon layer to planarize the surface of said substrate, and removing said planarization layer to expose said third insulating layer, said HSG polysilicon layer and said conductive layer being effective together as a storage electrode of a capacitor, said planarization layer being formed thicker than the height of said third insulating layer;

completely removing said planarization layer and said third insulating layer through a wet etch; and sequentially forming a dielectric layer and plate electrode on said storage electrode.

12. The method for fabricating a capacitor of a semiconductor device as claimed in claim 11, wherein, in said step of forming a third insulating layer, said first insulating layer does not mask with said second insulating layer.

13. The method for fabricating a capacitor of a semiconductor device as claimed in claim 11, wherein said first and third insulating layers are formed of materials having similar etch rates, and said first and second insulating layers are formed of materials having different etch rates.

14. The method for fabricating a capacitor of a semiconductor device as claimed in claim 11, wherein said first and third insulating layers are formed of an identical material, and said first and second insulating layers are formed of materials having different etch rates.

15. The method of claim 1, wherein said first conductive layer is metallic.

16. The method of claim 9, wherein said conductive layer is metallic.

17. The method of claim 12, wherein said conductive layer is metallic.

18. The method of claim 15, wherein said first conductive layer is a combination of Ti, TiN and W.

19. The method of claim 16, wherein said first conductive layer is a combination of Ti, TiN and W.

20. The method of claim 17, wherein said first conductive layer is a combination of Ti, TiN and W.

* * * * *